United States Patent
Mazzaro (10) Patent No.: US 9,151,787 B2
(45) Date of Patent: Oct. 6, 2015

(54) METHOD AND APPARATUS FOR THE MEASUREMENT OF RADIO-FREQUENCY ELECTRIC PERMITTIVITY BY A MEANDER-LINE RING RESONATOR

(71) Applicant: U.S. Army Research Laboratory, Adelphi, MD (US)

(72) Inventor: Gregory J. Mazzaro, Columbia, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 302 days.

(21) Appl. No.: 13/666,404

(22) Filed: Nov. 1, 2012

(65) Prior Publication Data

US 2013/0181725 A1 Jul. 18, 2013

Related U.S. Application Data

(60) Provisional application No. 61/586,160, filed on Jan. 13, 2012.

(51) Int. Cl.
*G01R 27/32* (2006.01)
*G01R 27/04* (2006.01)
*H01P 7/00* (2006.01)
*G01R 27/26* (2006.01)
*H01P 7/08* (2006.01)

(52) U.S. Cl.
CPC ............ *G01R 27/04* (2013.01); *G01R 27/2623* (2013.01); *H01P 7/00* (2013.01); *H01P 7/082* (2013.01)

(58) Field of Classification Search
CPC .... G01R 27/04; G01R 27/32; G01R 27/2623; H01P 7/00; H01P 7/082
See application file for complete search history.

(56) References Cited

U.S. PATENT DOCUMENTS

| | | | |
|---|---|---|---|
| 5,892,490 A | 4/1999 | Asakura et al. | |
| 5,986,616 A * | 11/1999 | Edvardsson | 343/853 |
| 6,700,459 B2 * | 3/2004 | Raihn et al. | 333/99 S |
| 7,193,418 B2 * | 3/2007 | Freytag | 324/318 |
| 2003/0222737 A1* | 12/2003 | Mordkovich | 333/204 |
| 2007/0052502 A1* | 3/2007 | Koizumi et al. | 333/204 |
| 2012/0245724 A1* | 9/2012 | Erturk et al. | 700/108 |

OTHER PUBLICATIONS

K. Chang and L. H. Hsieh, "Analysis and modeling of ring resonators," in Microwave Ring Circuits and Related Structures, 2nd ed., Hoboken, NJ: John Wiley & Sons, 2004, ch. 2, sec. 2.2, pp. 6-7.
K. Sarabandi and E. S. Li, "Microstrip ring resonator for soil moisture measurements," IEEE Transactions on Microwave Theory and Techniques, vol. 35, No. 5, pp. 1223-1231, Sep. 1997.

(Continued)

*Primary Examiner* — Minh N Tang
(74) *Attorney, Agent, or Firm* — John H. Raubitschek; Eric B. Compton (57) ABSTRACT

Methods and apparatus for measuring permittivity having a meander-line ring resonator, which may be disposed on a substrate proximate to and separated from an input coupler and an output coupler thereon, the resonator ring further including a continuous conductive material having at least two turns to form a single congruent pattern, symmetrical along at least one axis.

24 Claims, 10 Drawing Sheets

(56) References Cited

OTHER PUBLICATIONS

D. M. Pozar, "Electromagnetic Theory," in Microwave Engineering, 3rd ed., Hoboken, NJ, John Wiley & Sons, 2004, ch. 1, sec. 1.3, pp. 10.

G. D. Smith, "U.S. Army Research Laboratory (ARL) Very High Frequency (VHF) I Ultra High Frequency (UHF) permittivity measurement software: Data capture and reduction," ARL Technical Report, No. 4780, Apr. 2009.

N. M. Shebani, B. H. Khamoudi, and A. S. Abul-Kassem, "Measurement of dielectric constant of some materials using planar technology," International Conference on Computer and Electrical Engineering, vol. 2, pp. 352-356, Dec. 2009.

R. A. Yogi, S. A. Gangal, R. C. Aiyer, and R. N. Karekar, "Microwave ring resonator as a novel bio-material moisture sensor," Sensors and Actuators B: Chemical, vol. 50, No. 1, pp. 38-44, Jul. 1998.

M. Ressler, L. Nguyen, F. Koenig, D. Wong, and G. Smith, "The Army Research Laboratory (ARL) Synchronous Impulse Reconstruction (SIRE) forward-looking radar," Proceedings of the SPIE, vol. 6561, Apr. 2007.

G. Mazzaro, K. Sherbondy, and J. Hu, "Portable Ring-Resonator Permittivity Measurement System," USNC-URSI National Radio Science Meeting, Boulder, CO, Jan. 4-7, 2011. (Abstract).

Presentation titled "Portable Ring-Resonator Permittivity Measurement System," given at the USNC-URSI National Radio Science Meeting, Jan. 5-8, 2011, Boulder, CO. (abstract on a CD-ROM disturbed to conference attendees at registration; presentation given Jan. 6, 2011; slides posted to http://www.gjmazzaro.com/ on or about Feb. 21, 2012).

G. Mazzaro, K. Sherbondy, G. Smith, and J. Hu, "Portable Ring Resonator Permittivity Measurement System," 57th Annual Meeting of the MSS Tri-Service Radar Symposium, Monterey, CA, Jun. 28, 2011. (summary of paper submitted on Jan. 21, 2011; paper presented and poster displayed at conference on Jun. 28, 2011; paper on a CD-ROM distributed to conference attendees in Feb. 2012).

* cited by examiner

METHOD AND APPARATUS FOR THE MEASUREMENT OF RADIO-FREQUENCY ELECTRIC PERMITTIVITY BY A MEANDER-LINE RING RESONATOR

CROSS REFERENCE TO RELATED APPLICATIONS

This application claims benefit of U.S. provisional patent application Ser. No. 61/586,160, filed Jan. 13, 2012, which is herein incorporated by reference.

GOVERNMENT INTEREST

Governmental Interest—The invention described herein may be manufactured, used and licensed by or for the U.S. Government.

FIELD OF INVENTION

Embodiments of the present invention generally relate to a method and apparatus to measure the electromagnetic properties of materials. Specifically, the use of a radio frequency (RF) meander-line ring resonator to measure the permittivity of a material.

BACKGROUND OF THE INVENTION

It is critical that military personnel timely identify enemy objects and combatants, and even more so as modern warfare occurs more frequently in urban areas. The urban environment presents situations where it becomes increasingly necessary to identify objects hidden behind walls and underfoot. In recent years, ground penetrating radar (GPR) has been crucial in the identification of subterranean objects such as improvised explosive devices (IEDs).

In order for the aforementioned radar to operate properly, modeling of the radar environment needs to accurately represent the materials encountered in-theater. Electromagnetic properties of materials in the environment determine the depth at which objects can be detected by the radar. One such property is permittivity ($\in$), which indicates the transmission, reflection, and absorption of EM radiation by a dielectric material. Since permittivity is an intrinsic material property that depends on temperature and water content, the $\in$ for sand, soil, and vegetation varies by location and time-of-day. Thus, to accurately model the behavior of radar pulses in a test environment, permittivity must be measured as near to the radar test area as possible.

Several techniques exist for measuring the permittivity of dielectric samples. At radio frequencies (RF), two popular techniques are reflectometry and scatterometry. Reflectometry disadvantageously requires disturbing the sample by inserting probes. Also, a reflectometer, such as a pulse generator and oscilloscope, must be brought to the radar experiment site. Scatterometry disadvantageously requires that the measurement must be taken in the far-field, at a distance of at least several wavelengths from the sample. At this far-field distance, the sample must be several wavelengths in length and width for the measurement to be valid. An alternative method is to use ring resonators, which requires that a scalar network analyzer (or equivalent circuit) and a microstrip ring are brought to the experiment site. The ring-resonator measurement can be taken without disturbing the dielectric sample.

Figure 1:
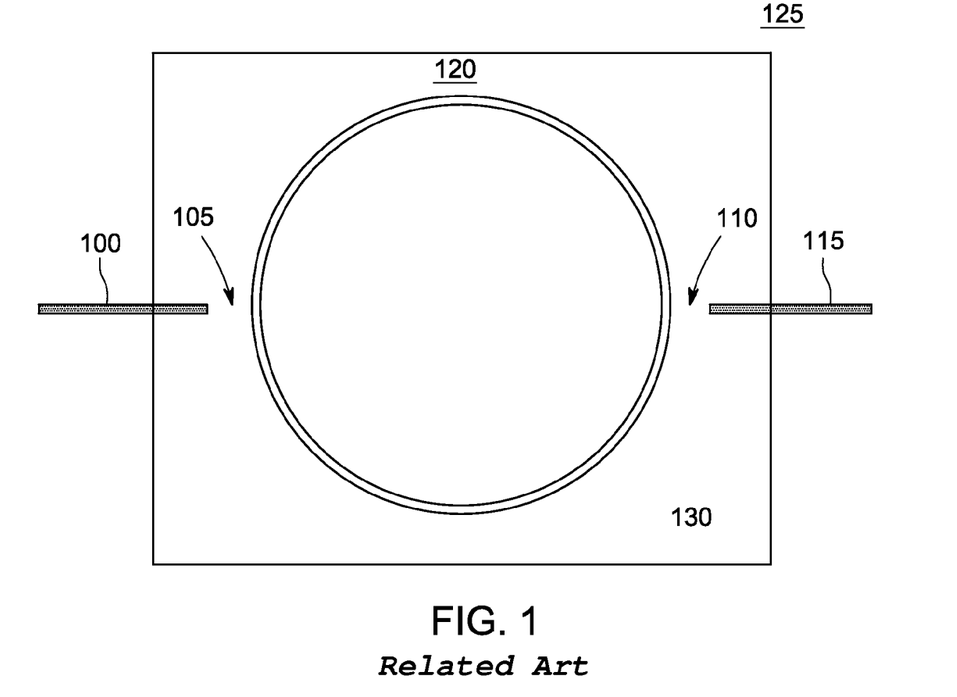
FIG. 1 is an illustration of a traditional circular ring resonator.

FIG. 1 is an illustration of a traditional circular ring resonator. The traditional ring resonator 125 is used in the measurement of permittivity of a dielectric sample 130 at frequencies above 1 GHz. The ring resonator 125 comprises an input feed line 100, a resonating ring 120, and an output feed line 115 disposed on a substrate (not shown). For measurement, a dielectric sample 130 is placed against the ring resonator 125. At the resonant frequency of the ring and multiples thereof, RF energy couples from the input feed line 100 to the ring 120 over a first gap 105, and from the ring 120 over a second gap 110 to the output via a second feed line 115. Permittivity is measured by comparing the resonance of the ring without a dielectric sample present to the resonance of the ring when a dielectric sample 130 is applied.

Figure 2:
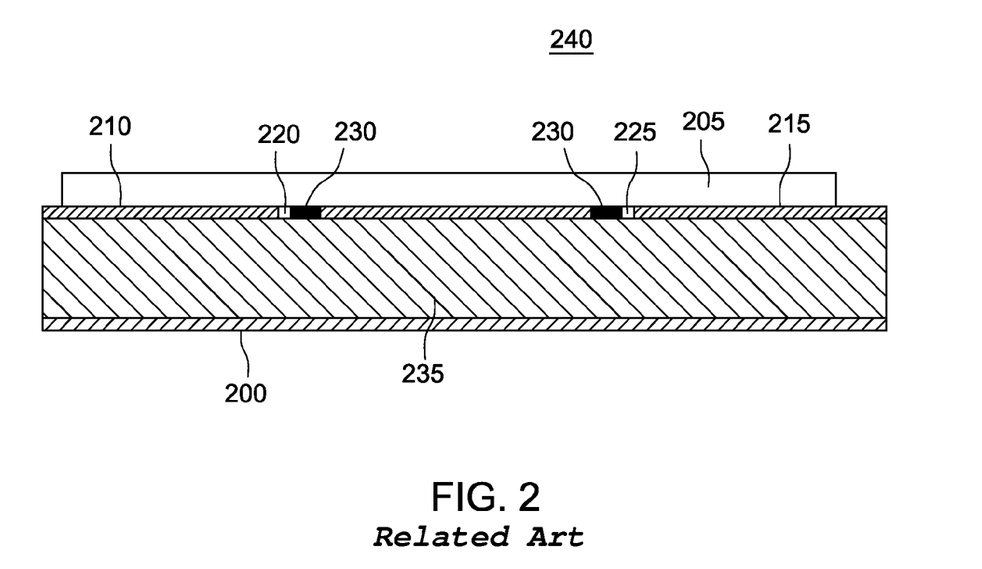
FIG. 2 is an illustration of applying a sample to a traditional circular ring resonator.

FIG. 2 is an illustration of applying a sample to a traditional circular ring resonator. The cutaway illustration of applies a sample material 205 flush onto the ring resonator 230 that is disposed on a dielectric substrate 235 and a ground plane 200. At resonance, a signal passes from the input feed line 210, couples over a first gap 220 to the ring 230, travels around the ring, and couples over a second gap 225 to the output feed line 215.

Given that the test sample 205 must be flush against the ring surface 230, it is increasingly difficult to ensure a flush fit at relatively low (e.g. below GHz) frequencies as the corresponding area of the ring and sample size increases. Thus, a traditional circular ring resonator is impractical for measuring permittivity below 1 GHz as the ring becomes prohibitively large (e.g. several feet across). These lower frequencies are used by GPR, though, because they offer deeper ground penetration using relatively low transmit power. Since accurate radar modeling must account for frequencies under 1 GHz, the permittivity of materials in the radar environment must be measured at such frequencies; thus, improved techniques are needed to measure permittivity.

A portable system may be useful to measure permittivity quickly in the field, with minimal disturbance of the dielectric sample, at ground penetrating frequencies.

BRIEF SUMMARY OF THE INVENTION

A method, system, and apparatus for a meander-line ring resonator are described herein. Specifically, the meander-line ring resonator for measuring permittivity comprises: a meander-line ring, which may be disposed on a substrate proximate to and separated from input and output couplers thereon; the resonator further including a continuous conductive material on the substrate with at least two turns forming a single congruent pattern, symmetrical along at least one axis.

In some embodiments, an apparatus for the meander-line ring resonator includes electronics for detecting the permittivity of responses from an electric field applied to a dielectric sample. Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION OF THE INVENTION

Embodiments of the present invention relates to a meander-line ring resonator. One embodiment of the meander-line ring resonator measures permittivity of a dielectric sample such as soil. Profiling of moist soils and sands most notably aids in the design and implementation of ground penetrating radar. However, sampling dielectric materials may aid in the design of other radar applications.

The meander-line ring resonator includes a series of turns (i.e. at least two) in the meander-line ring to reduce the overall area occupied on the substrate by the ring while maintaining the same continuous length of the ring. The turns of the ring are congruent in at least one axis such that there is efficient resonance of the fields across the ring structure from one end to another. The at least one axis may be defined between the at least two turns, such as, for example, an axis coincident with input and output lines of input and output couplers to the ring. By contrast, the traditional ring resonator might be thought of as being substantially circular having only one continuous turn. Further embodiments may include elongated couplers conforming to a percentage of the shape of the ring at either side of the ring that facilitate coupling and decreases transmission loss.

Figure 3:
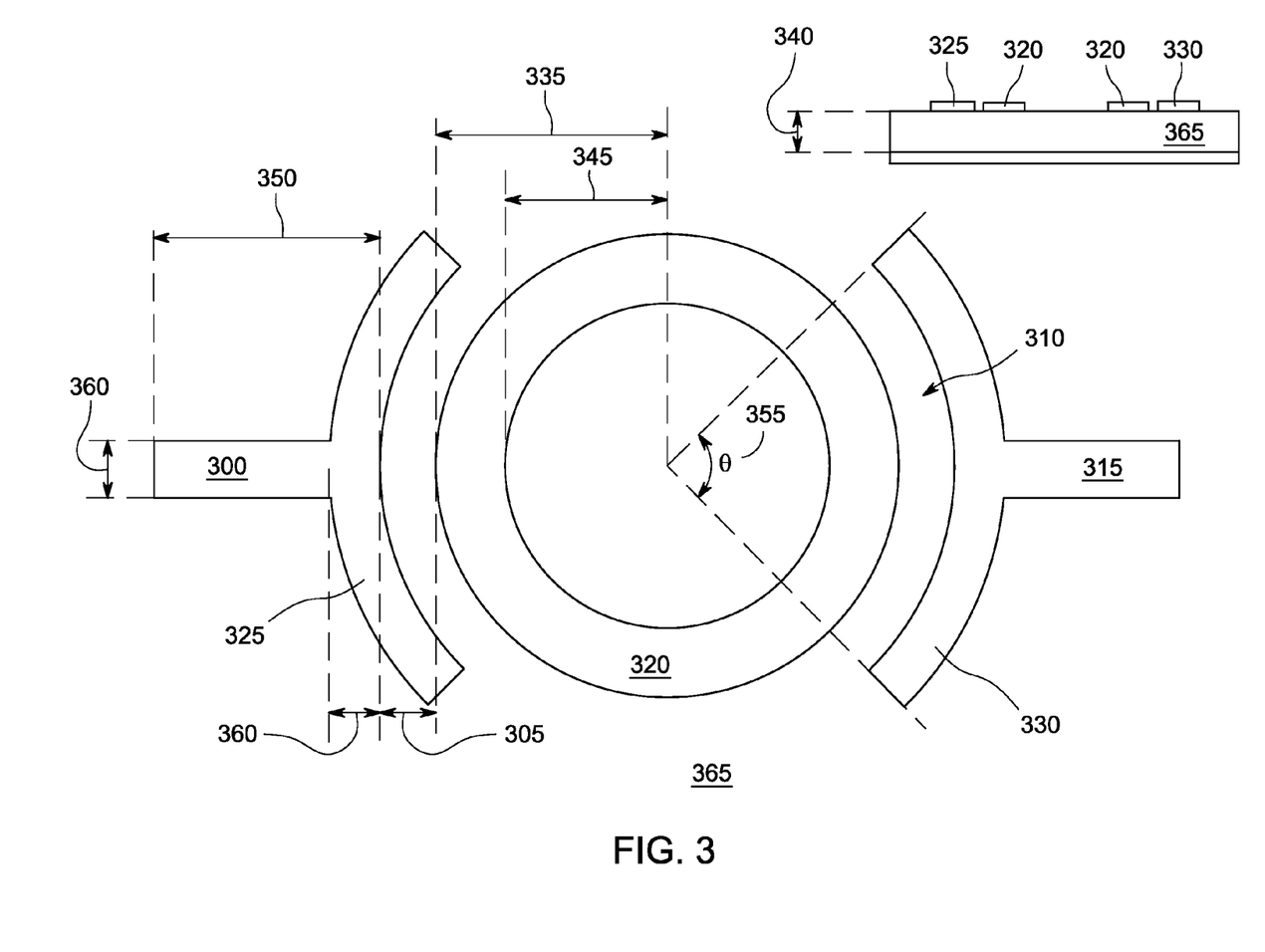
FIG. 3 illustrates an exemplary feature of an embodiment of the present invention.

FIG. 3 illustrates an exemplary feature of an embodiment of the present invention. Depicted is a resonance ring circuit 365 including a pair of extended arcuate couplers (depicted as 325 and 330) for improved coupling of signals to and from the ring 320. The resonance ring circuit comprises an input line 300, an input coupler 325, an output line 315, an output coupler 330, and a resonating ring 320. The input line 300 is coupled to the center of the arcuate input coupler 325 and the output line 315 coupled to the center of the arcuate output coupler 330. The input line 300 capacitively couples over a first gap 305 to the resonating ring 320, and the opposite side of the ring 320 capacitively couples over a second gap 310 to the output line 315. Other embodiments may include couplers (325 and 330) which are not opposite to one another but offset at a different angle.

The couplers 325 and 330 are arcuate to conform to the resonating structure of the ring 320. As will be discussed below, further embodiments may include couplers that are conformal to resonators that are not of a circular ring shape. The conformal embodiments will have couplers greater in size than the connected feed lines, and such that the length is a substantial percentage of the resonator ring shape.

Capacitive coupling is enhanced by adding elongated couplers (325 and 330) to the ends of the input line 300 and output line 315 closest to the resonating ring 320. In the illustrated embodiment, the couplers (325 and 330) form shapes similar to the edges of the resonating element 320, and in this example the couplers (325 and 330) are arcs of substantially the same width (arrow 360) as the resonating ring 320. The arc length of the couplers (325 and 330) may be expressed as a percentage of the inner diameter of the ring 320. For impedance matching, input and output lines and couplers (300, 325, 330, and 315) to the ring 320 have substantially the same thickness (arrow 360). In other embodiments, the thickness and/or width of the ring 320 may be different from the thickness and/or width of the couplers (325 and 330).

The resonating ring 320 comprises a conductive material with a continuous inner radius $r_i$ (shown as 345) and a continuous outer radius $r_0$ (shown as 335) on an exemplary Rogers 4350B substrate 365, with a height h (shown as 340). Insertion loss from input line 300 to the ring 320 and to output line 315 is reduced by decreasing the spatial separation of the coupling gaps (arrows 305 and 310) while increasing the size the input and output couplers (325 and 330). Excessive loss for a ring resonator will cause the input output characteristic to fall below the noise floor of the network analyzer and the resonant peak will be lost. Coupling gaps (arrows 305 and 310) have been exaggeratedly separated from the ring 320 to facilitate understanding.

To determine microstrip dimensions necessary to form an exemplary 50-Ω line that resonates at the desired frequency $f_0$, the following relationships are used:

$$Z_0 = Z_0^{air} / \sqrt{|\varepsilon_{eff}|} \tag{1}$$

$$Z_0^{air} = 60 \ln\left[\frac{F_1 h}{w} + \sqrt{1 + \left(\frac{2h}{w}\right)^2}\right] \tag{2}$$

$$F_1 = 6 + (2\pi - 6)\exp\{-(31h/w)^{0.7528}\} \tag{3}$$

$$|\varepsilon_{eff}| = \frac{\varepsilon_r + 1}{2} + \left(\frac{\varepsilon_r - 1}{2}\right)\left(1 + \frac{10h}{w}\right)^{-ab} \tag{4}$$

$$a = 1 + \frac{1}{49}\ln\left[\frac{(w/h)^4 + \{w/(52h)\}^2}{(w/h)^2 + 0.432}\right] + \frac{10}{187}\ln\left[1 + \left(\frac{10w}{181h}\right)^3\right] \tag{5}$$

$$b = 0.564\left[\frac{\varepsilon_r - 0.9}{\varepsilon_r + 3}\right]^{-0.053} \tag{6}$$

$$\lambda_g = \frac{c}{f_0\sqrt{|\varepsilon_{eff}|}} \tag{7}$$

-continued $$r_{avg} = \frac{n\lambda_g}{2\pi} \quad (8)$$

$$= \frac{n \cdot c}{2\pi \cdot f_0 \sqrt{|\varepsilon_{eff}|}}$$

$$= \frac{(1)(3 \cdot 10^8)}{(2\pi)(900 \cdot 10^6)\sqrt{2.86}}$$

$$= 31.37 \text{ mm}$$

$$r_i = r_{avg} - w/2 = 31.37 \text{ mm} - 0.56 \text{ mm} = 30.81 \text{ mm} \quad (9)$$

$$r_o = r_{avg} + w/2 = 31.37 \text{ mm} + 0.56 \text{ mm} = 31.93 \text{ mm} \quad (10)$$

$$s = \lambda_g/4 = (197.2 \text{ mm})/4 = 49.3 \text{ mm} \quad (11)$$

where $\varepsilon_r$ is the substrate permittivity, w (shown as 360) is the microstrip line width, $Z_0$ is chosen to be 50Ω, c is the speed of light, and n is the order of the resonance whose lowest value (to achieve the lowest resonant frequency for a particular ring) is 1. The guided wavelength $\lambda_g$ of the RF in the microstrip at a particular desired frequency $f_0$ is determined by Equation (7). Equations (8)-(11) disclose the results from an exemplary desired design frequency of 900 MHz where $r_{avg}$ is the average radius and s is the input/output feed line length of one quarter-wavelength. The arc angle 355 may also be calculated. Thinning the coupling gaps 305 and 310 before the feed line/ring separation increases capacitive coupling.

Figure 4:
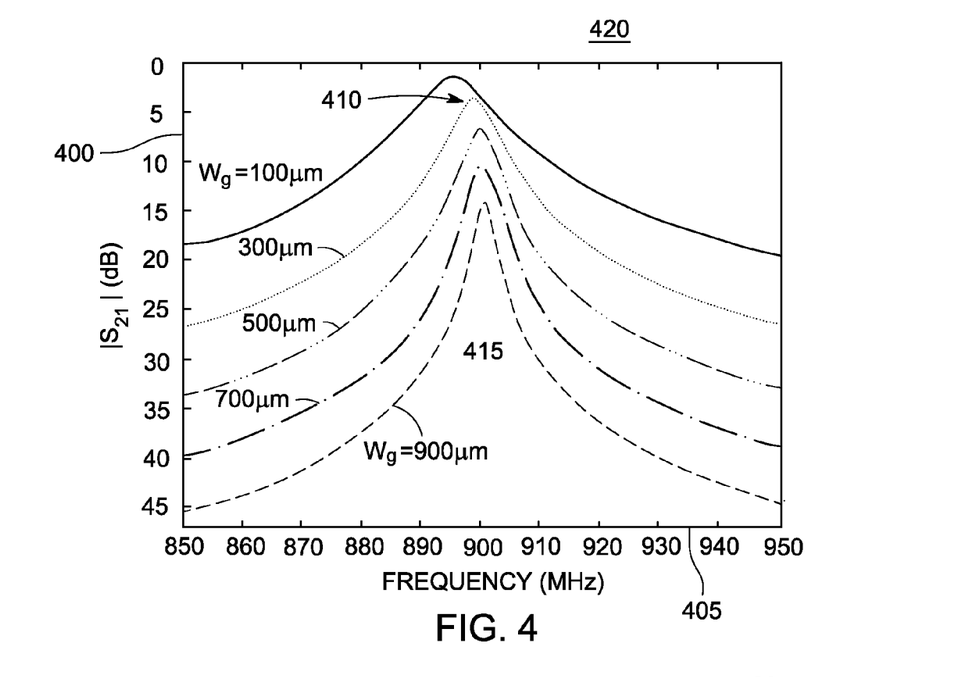
FIG. 4 depicts a graph of results from changing the geometric width of the exemplary feature of an embodiment of the present invention.

FIG. 4 depicts a graph of results from changing the geometric width of the exemplary feature of an embodiment of the present invention. The graph 420 of transmission coefficient $|S_{21}|$ 400 versus frequency 405 and indicates that if thinning gap width ($w_g$) is great enough, the quality factor (Q) may be lowered 410 and skew the desired resonance 415. Otherwise, the thinning in FIG. 4 provides desirable increased capacitive coupling leading to gains in the transmission coefficient $|S_{21}|$ (shown as 400).

Figure 5:
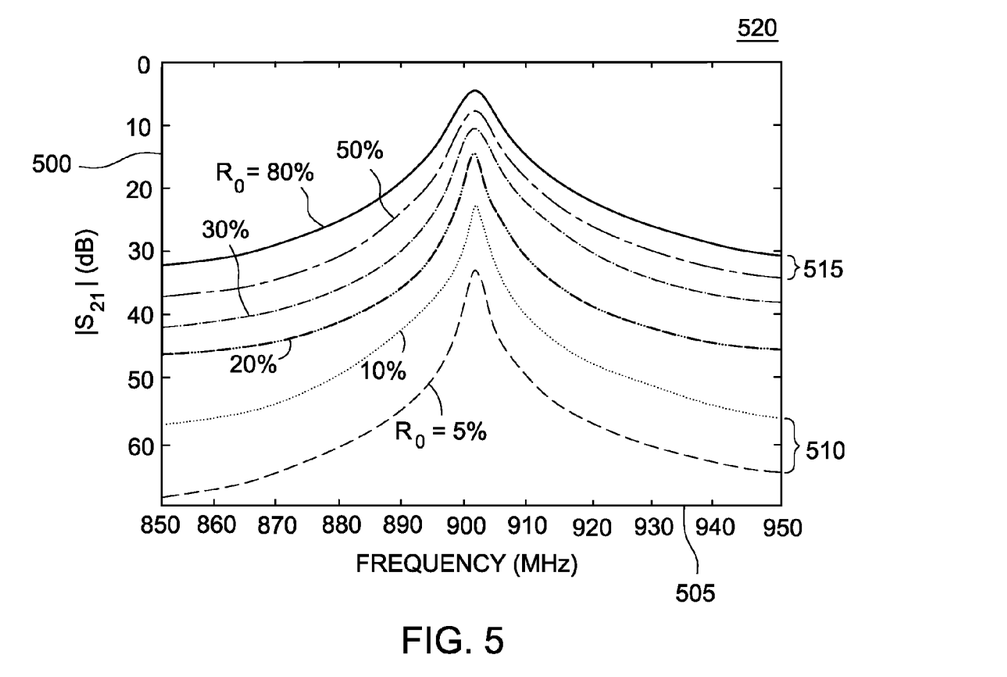
FIG. 5 depicts a graph of results from changing the radial geometry of the exemplary feature of an embodiment of the present invention.

FIG. 5 depicts a graph of results from changing the radial geometry of the exemplary feature of an embodiment of the present invention. FIG. 5 is a graph 520 comparing $|S_{21}|$ (shown as 500) with frequency 505 to show widening the arc lengths results in a lower quality factor 515 as opposed to the higher quality factor 510 found in smaller arc lengths. The combination of reduced gap width and longer feed line arcs provides decreased insertion loss which is best for the permittivity measurement, especially for lossy samples whose $|S_{21}|$ characteristic might otherwise fall below the noise floor of the measurement.

Figure 6:
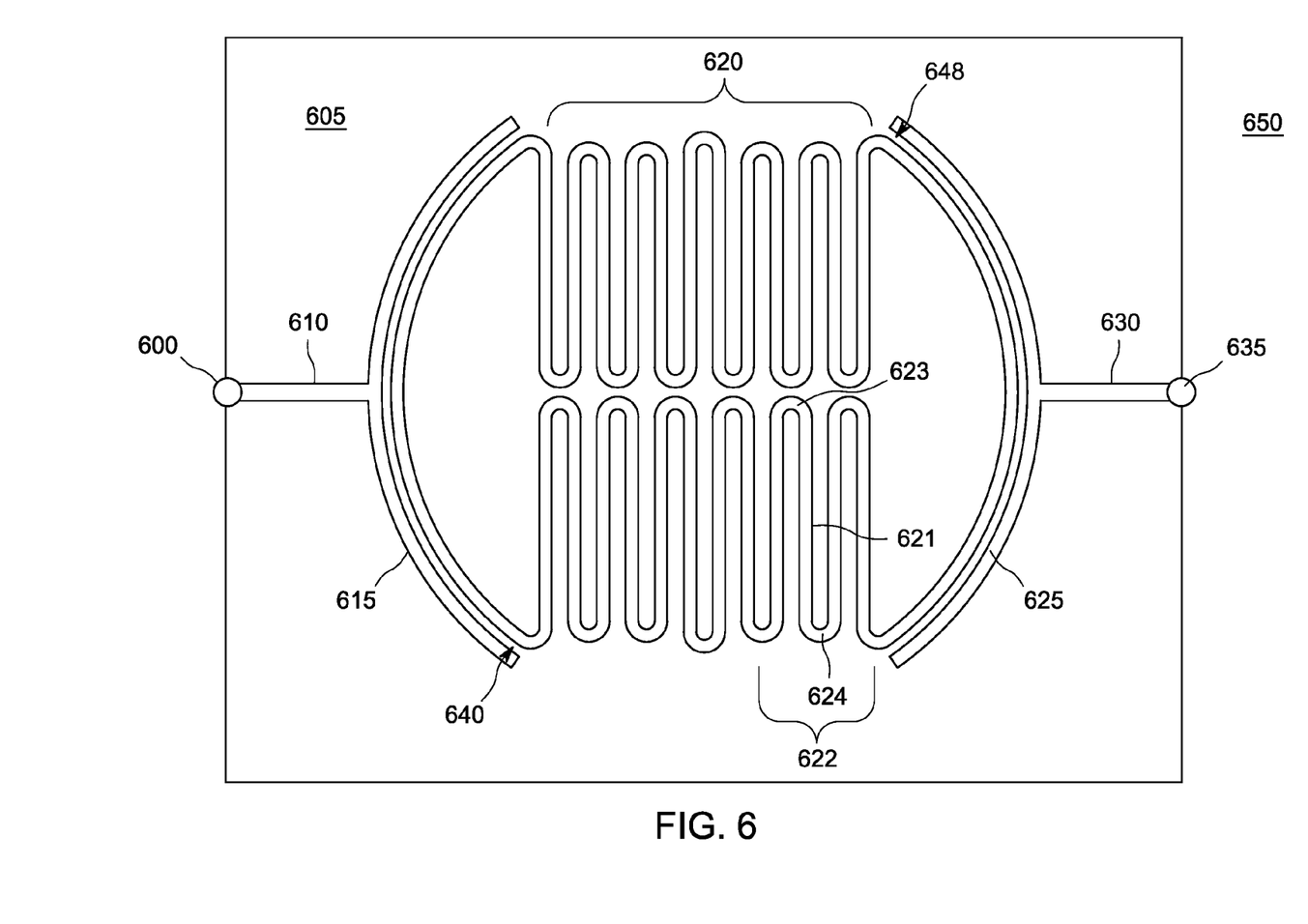
FIG. 6 depicts a top plan view of an exemplary embodiment of the present invention.

FIG. 6 is a top plan view of an exemplary embodiment of the present invention. The meander-line ring resonator 650 comprises an input connector 600, an input feed line 610, an input coupler 615, a meander-line ring 620, an arcuate output coupler 625, an output feed line 630, and an output connector 635 on a substrate area 605. The substrate 605 may be comprised of hydrocarbon, glass, ceramics or combinations thereof, such as Rogers 4350B. The input feed line 610 is connected to the center of the arcuate input coupler 615 and the output feed line 630 is connected to the center of the arcuate output coupler 625. In the exemplary embodiment a swept-frequency input signal is sent from an input connector 600, travels to an input feed line 610 and input coupler 615, capacitively couples to the resonator 620, capacitively couples to an output coupler 625, and travels to an output feed line 630 in contact with an output connector 635. In one embodiment, connecters 600 and 635 may be Subminiature Version-A (SMA) connectors. The meander-line ring 620 comprises a pair of arcuate portions 623 and 624 aligned to form the pair of serpentine portions 621 coupling the arcuate portions 623 and 624 to each other.

Since a lower frequency is proportionally related to the conductive path length of the ring, turns 622 are added to lower the frequency of the resonance. Turns 622 are herein defined as part of the meandering ring 620 are acute bending serpentine portions in the single continuous conductive strip 624 comprising the resonating element 620. Compared to a circular ring of the same resonant frequency, the path length of the microstrip ring after adding turns 622 to meander the line 624 is the same as before adding the turns 622, but the area enclosed by the ring 620 after adding turns is smaller. In the meander-line ring resonator 650, the substrate area 605 occupied is reduced by a factor given by $$F = \frac{A_t}{A_m} \quad (12)$$

In Equation (12), F is the ratio of the area of the circular ring $A_t$, divided by the area of the meander-line ring $A_m$. $A_t$ is calculated with the traditional formula for the area of a circle, $\pi \cdot r^2$, and $A_m$ is calculated by multiplying the approximate length and width occupied by the turns of the meandering line. While the depth of the dielectric sample required for measurement remains unchanged, the area of the sample that contacts the resonator is reduced by F such that the volume of the sample required for a valid measurement is also reduced by F.

The exemplary embodiment further employs aforementioned reduced coupling gap widths 640 and 648 along with widened feed line curved/arched shapes 615 and 625 for decreased insertion loss. The enlarged shapes as discussed above, provide decreased insertion loss. Ultimately, a low resonance frequency is achieved across a smaller substrate area 605 not previously thought possible.

Figure 7:
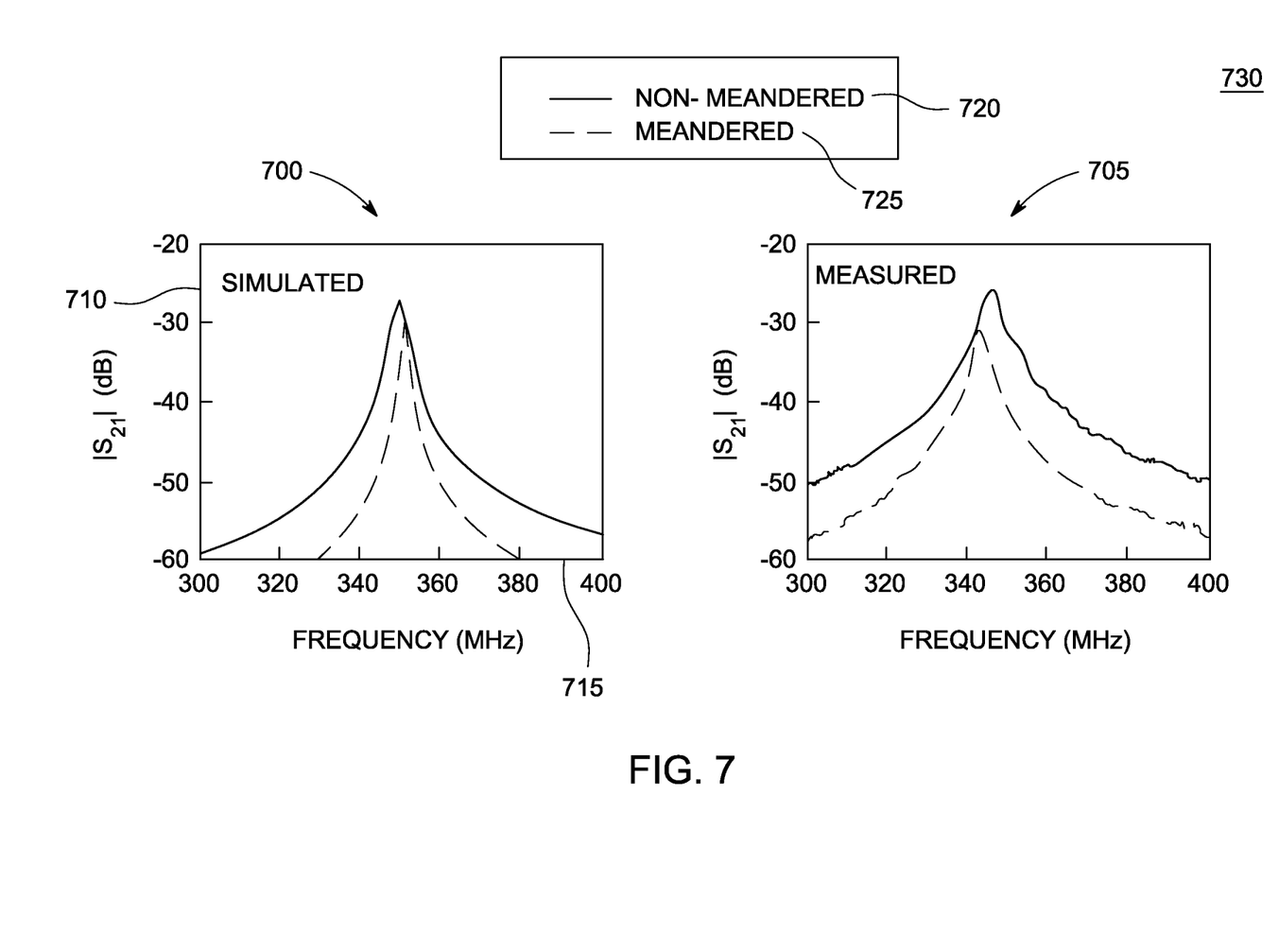
FIG. 7 depicts a graph of an example of a frequency response from an embodiment of the present invention compared to that of a traditional circular resonator.

FIG. 7 is a graph comparing exemplary frequency response from an embodiment of the present invention compared to that of a traditional circular resonator. The comparison graph 730 of a transmission coefficient $|S_{21}|$ 710 versus frequency 715 for simulated 700 and measured 705 meandered 725 and non-meandered 720 ring resonators. The path length of the meandered line is set equal to the circumference of the non-meandered traditional loop. Since the ring length is the same between the two resonator structures, the voltage standing wave patterns established along each ring are the same and therefore the resonant frequencies are substantially the same in FIG. 7. Results show a similar $|S_{21}|$ pattern 710, thus proving that compacting a resonator of a given frequency $f_0$ into a smaller area is made possible by meandering the ring. As discussed below, at 900 MHz, the area may be reduced by a factor of 8.

Figure 8:
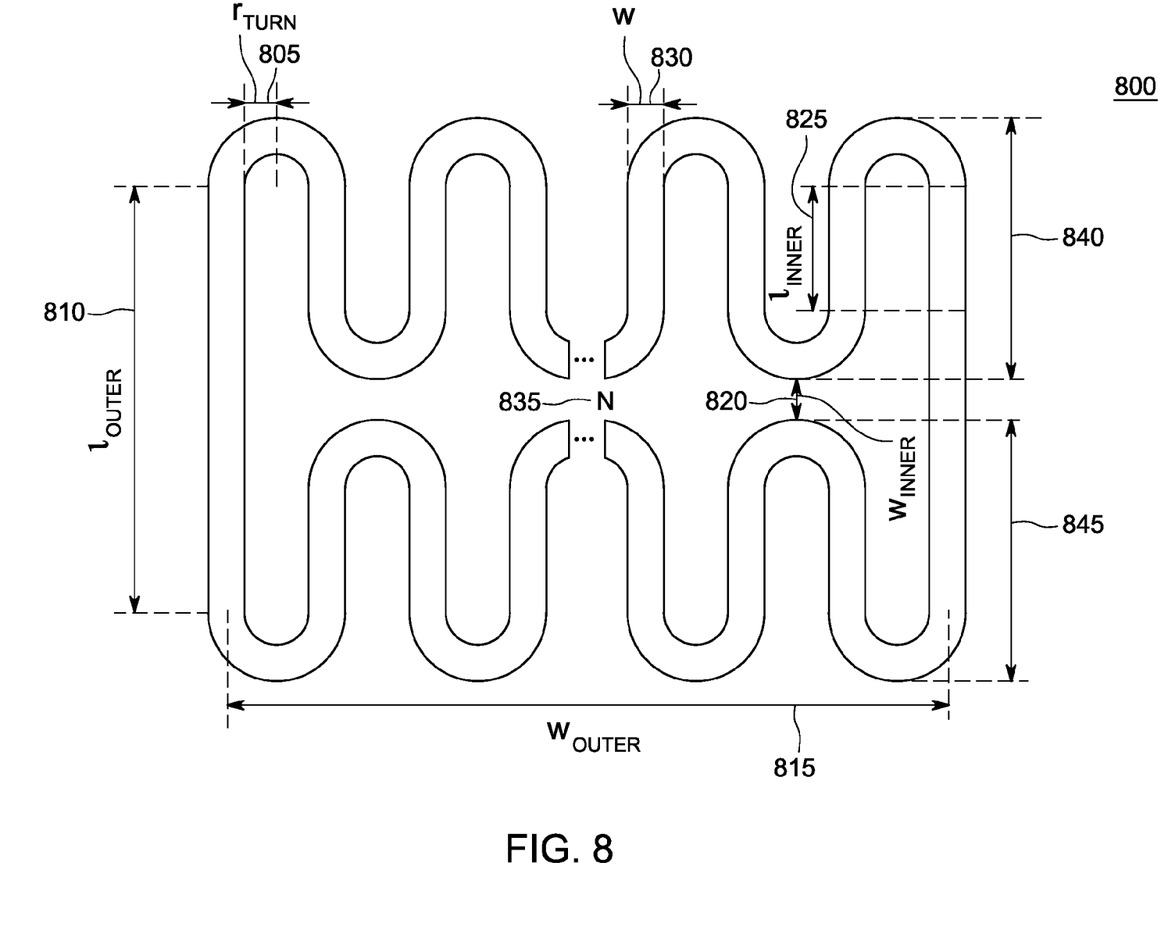
FIG. 8 is an exemplary embodiment of compacting the traditional average ring radius using turns to form a meander-line ring resonator.

FIG. 8 is an exemplary embodiment of compacting the traditional average ring radius using turns to form a meander-line ring resonator 800. The resonator 800 has an overall rectangular shape of length $l_{outer}$ 810 and a width $w_{outer}$ 815 determined by the number of turns N (shown as 835) of the meander-line resonator 800. The inner turn radius is given by $r_{turn}$ 805 and the separation between the upper portion 840 and lower portion 845 of the meander-line be given by $w_{inner}$ 820. The total path length around the meander line $l_{meander}$ for this geometry is then given by the following equations:

$$l_{meander} = 2l_{outer} + N \cdot \pi r_{turn} + (N-2)l_{inner} \quad (13)$$

$$l_{inner} = \frac{1}{2}(l_{outer} - w_{inner} - 2r_{turn} - 2w) \quad (14)$$

$$l_{meander} = 2l_{outer} + N \cdot \pi w + \frac{1}{2}(N-2)(l_{outer} - 6w) \quad (15)$$

$$= \left(\frac{N}{2} + 1\right)l_{outer} + (N\pi - 3N + 6)w \quad (16)$$

The overall length of the meander-line is given by Equation (13) above, found by substituting the value of equation (14) above. In another embodiment, if the turn radius is set equal to the line width w (shown as 830) and the separation $w_{inner}$ (shown as 820) is set to twice this width, the total path length that of Equations (15) and (16).

The overall width of this rectangular geometry is calculated to be $$w_{outer} = N \cdot r_{turn} + \left(\frac{N}{2}\right)w = N \cdot w + \left(\frac{N}{2}\right)w = \frac{3}{2}N \cdot w \quad (17)$$

In an exemplary embodiment, using parameters from Equations (1)-(6) comprising a Rogers 4350B substrate, $Z_0$ is 50Ω, and w is 1.11 mm. At $f_0$=900 MHz, $r_{avg}$ is 3.14 cm and the area encompassed by a traditional circular resonator (not shown) at $f_0$=900 MHz is determined to be:

$$A_t = \pi r_{avg}^2 = \pi(3.14 \text{ cm})^2 = 30.9 \text{ cm}^2 \quad (18)$$

By meandering the line of a traditional resonator with N=10 turns yields:

$$3.14 \text{ cm} = \left(\frac{N}{2} + 1\right)l_{outer} + (N\pi - 3N + 6)w \quad (19)$$

$$l_{outer} = \frac{1}{11}\{3.14 \text{ cm} - (10\pi - 24)(0.111 \text{ cm})\} = 2.32 \text{ cm} \quad (20)$$

$$A_m = l_{outer} \cdot w_{outer} \quad (21)$$

$$= [2.32 \text{ cm}]\left[\left(\frac{3}{2}\right)(10)(0.111 \text{ cm})\right]$$

$$= 3.86 \text{ cm}^2$$

$$\frac{A_t}{A_m} = 30.9 \text{ cm}^2 / 3.86 \text{ cm}^2 \approx 8 \quad (22)$$

In the aforementioned example including Equations (1)-(6) and (18)-(19), by realizing a 10-turn meander-line geometry instead of the traditional circular structure, the area of the resonator printed on the substrate is reduced by a factor of 8. Therefore, the resonant frequency is under 1 GHz and the meander-line resonator occupies less than 4 cm² of space when printed on a Rogers 4350B substrate. Several different combinations of N turns and $l_{outer}$ length are still possible in additional exemplary embodiments of the rectangular meander-line geometry as will be discussed in FIG. 9. However, to be physically realizable and resonate at a given frequency $f_0$, the following constraints (23)-(25) must be observed:

$$l_{meander} = \lambda_g = 2\pi r_{avg} \quad (23)$$

$$N \geq 2, N \text{ even} \quad (24)$$

$$l_{outer} > w_{inner} + 2w + 2r_{turn} \quad (25)$$

Figure 9:
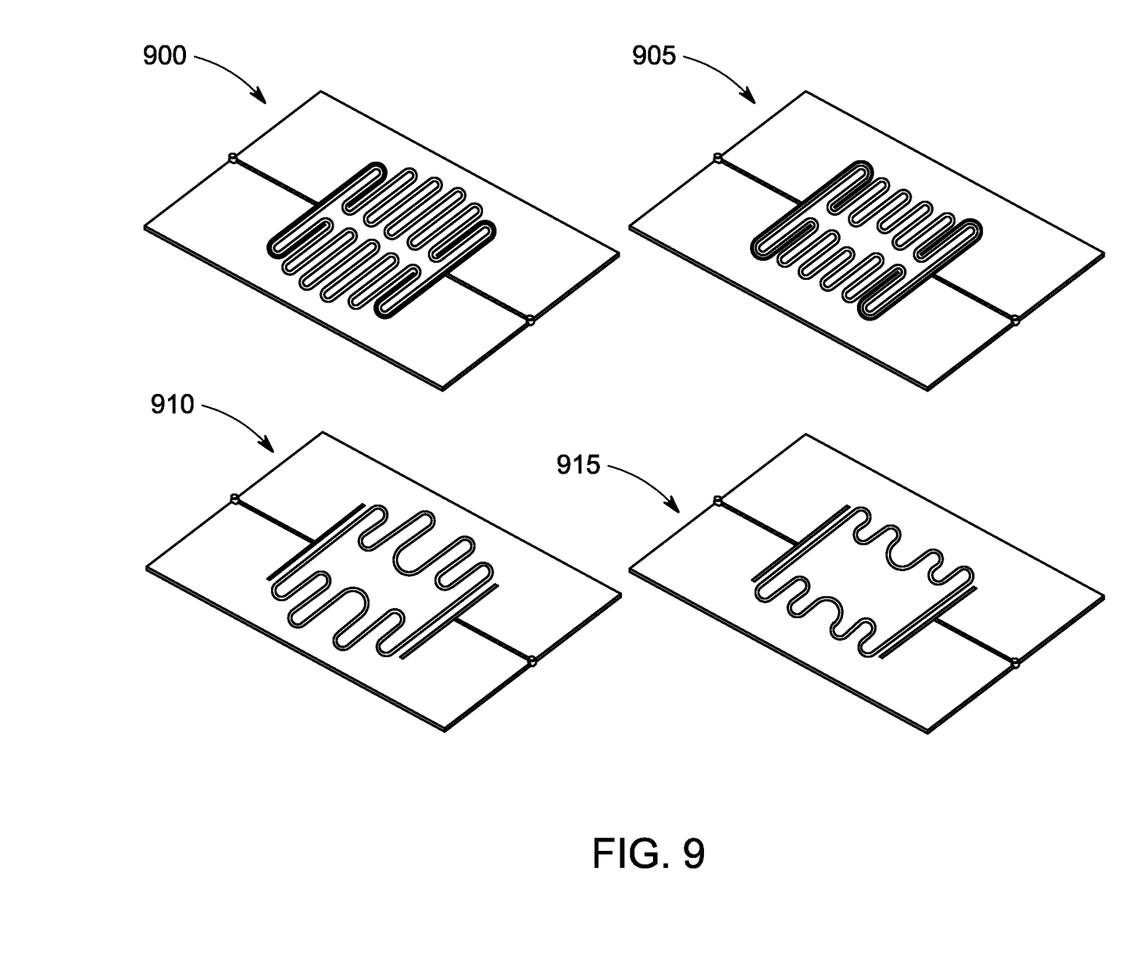
FIG. 9 illustrates alternative embodiments of the present invention resonating at different frequencies.

FIG. 9 illustrates alternative embodiments of the present invention resonating at different frequencies. FIG. 9 illustrates other possible lower frequency designs of the resonator for 250 MHz 900, 300 MHz 905, 400 MHz 910, and 550 MHz 915 with respective conformal couplers to optimize coupling efficiency. The resonator 900 at 250 MHz has a total of 12 turns, 6 of which are symmetrical along the axis of respective input and output lines. The resonator 905 at 300 MHz has a total of 12 turns, 6 of which are symmetrical to each other and along the axis of respective input and output lines. The resonator 910 at 400 MHz has a total of 8 turns, 4 of which are symmetrical along the axis of respective input and output lines. The resonator 915 at 550 MHz has a total of 8 turns, 4 of which are symmetrical to each other and along the axis of respective input and output lines. The common feature of the resonators being the continuous congruency in at least one axis because such symmetry is necessary for efficient resonance of the fields across the structure from one end to another. FIG. 9 also illustrates conformal couplers that are elongated to conform with the sides of the respective resonators such as in resonators 910 and 915 while resonators 900 and 905 conform to a percentage of the shape of the ring. While the aforementioned embodiments disclosed rounded edges, sharp corners may also be applied but may generate a degraded resonance.

Figure 10:
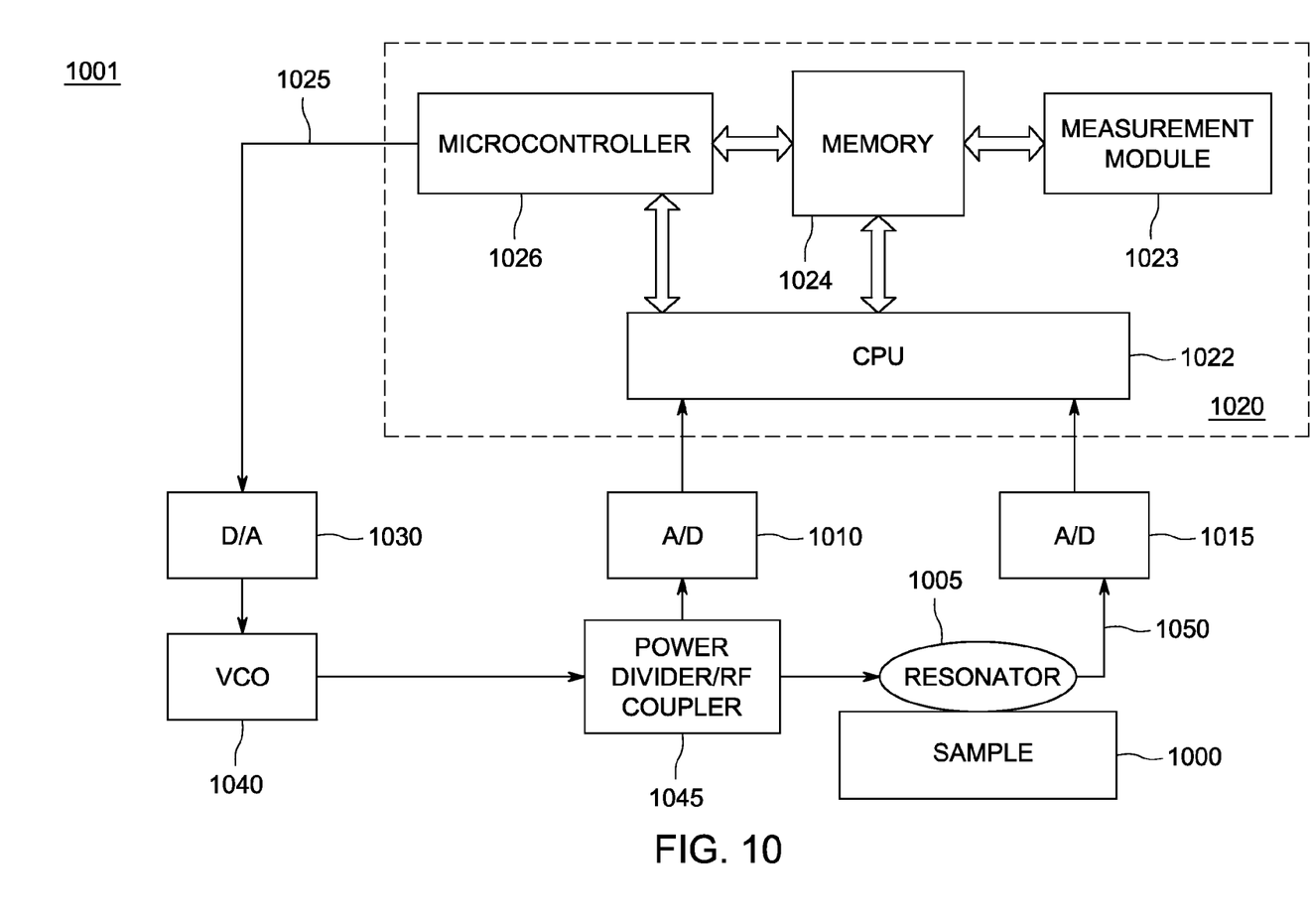
FIG. 10 illustrates an exemplary portable embodiment of the present invention.

FIG. 10 depicts a block diagram of an exemplary portable embodiment of the present invention. The reduced size of the meander-line ring resonator 1005 allows for a compact and portable permittivity measurement system 1001. The system 1001 comprises a portable computing system 1020, signal converters (1030, 1010, and 1015), a voltage controlled oscillator (VCO) 1040, a power divider 1045, and a meandering ring resonator 1005. A dielectric sample 1000 is positioned proximate to the resonator 1005 for measurement. The portable computer system 1020 comprising a microcontroller 1026, CPU 1022, memory 1024, and other components not shown to facilitate understanding (i.e. display, user interface, I/O ports). In some embodiments, the portable computer system 1020 may comprise a laptop. The CPU 1022 controls the frequency of a microcontroller 1026 such that the microcontroller 1026 communicates through a digital to analog converter (D/A) 1030 that converts digital signals from the microcontroller 1026 into analog signals. The analog signals control a voltage controlled oscillator (VCO) 1040 to generate a swept RF signal. The RF signal is coupled to a power divider/RF coupler 1045. In some embodiments, the VCO 1040 may operate between 400 MHz to 1300 MHz.

The power divider/RF coupler 1045 couples the RF signal to the analog to digital converter (ND) 1010 where the RF signal is digitized. The digitized signal is coupled to the CPU 1022 for calculating permittivity of the sample 1000. The power divider/RF coupler 1045 also couples the RF signal as an input to the ring resonator 1005. The ring resonator 1005 comprising the meandering structure and/or the aforementioned reduced insertion loss coupler structure. The resonator 1005 produces a near field, and more specifically, an electric field physically close to the resonator ring 1005 and substrate (not shown). The sample 1000 modifies the electric field of the meander-line ring resonator 1005 to produce an altered output signal 1050. The output signal 1050 is coupled to an ND converter 1015 for converting the analog RF signal to a digital representation of the signal. The digitized signal is coupled to the portable computer 1020 for calculating a signal change through a measurement module 1023. The digitized input and output signals and the comparison results may be stored in memory 1024. Embodiments of the present invention thus present a compact mobile means for permittivity measurement and further embodiments are able to measure solids as well as viscous liquids.

Figure 11:
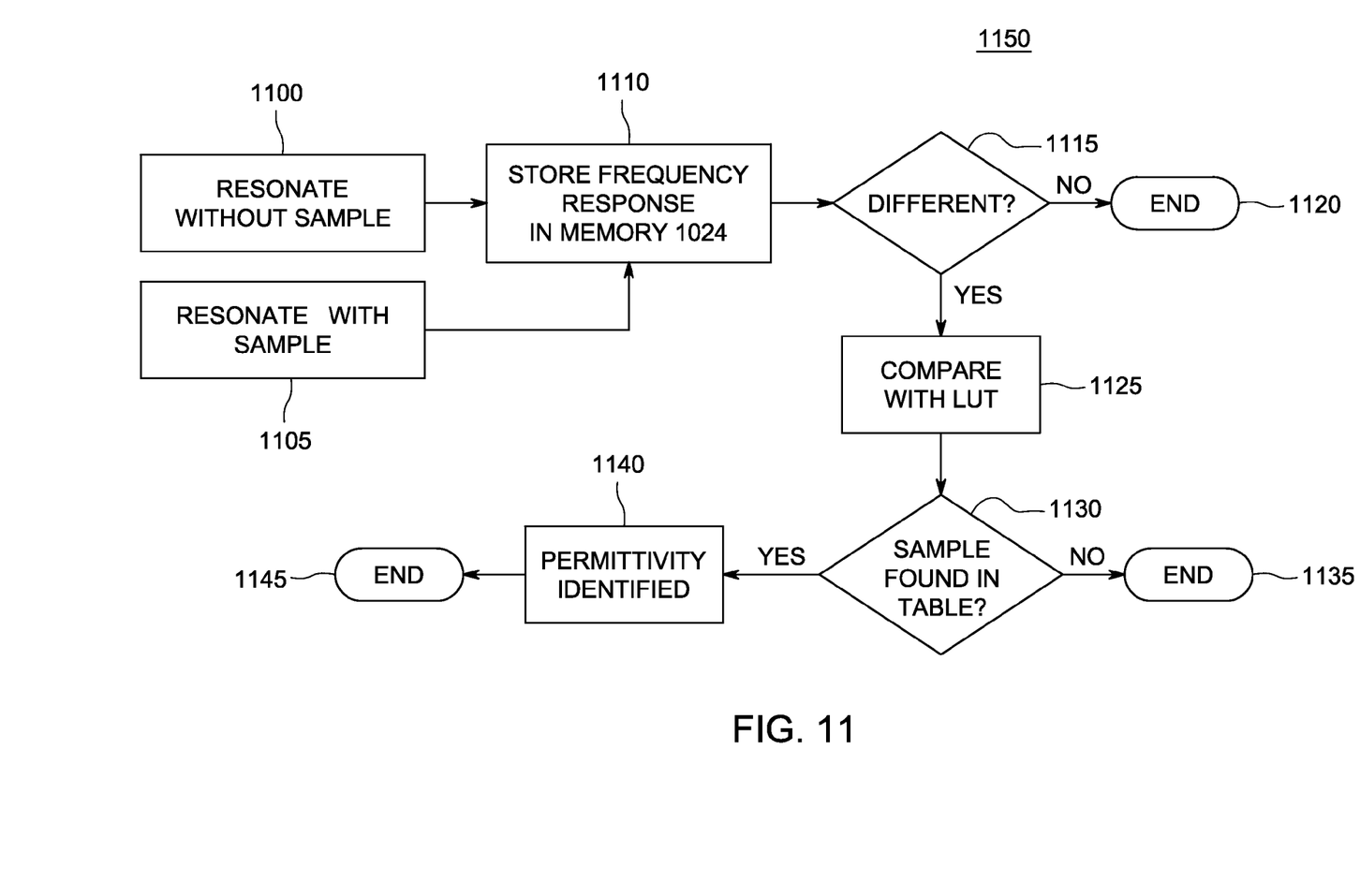
FIG. 11 depicts an exemplary flow diagram implementing the modules in FIG. 10.

FIG. 11 is a flow diagram of an exemplary embodiment of a method 1150 for implementing the modules of FIG. 10. FIG. 11 depicts a method for measuring a material with the meander-line ring resonator using instructions stored in memory 1024 (i.e. measurement module 1023). To determine a baseline frequency response, at step 1100 a RF voltage is applied to the meander-line ring resonator without a dielectric sample present. At step 1105, the method also applies an RF voltage to the resonator with a dielectric sample present to determine a frequency response for the sample. At step 1110, the frequency responses of steps 1100 and 1105 are stored.

At step 1115 the method compares the frequency responses from steps 1100 and 1105. If no difference is found, the method ends at step 1120, indicating there is no sample present or the sample is otherwise not determinable. Should a difference be found at the comparison step 1115, the method accesses a look up table (LUT) comprised of known frequency responses and, at step 1125, compares the present sample with the LUT values. If the sample difference is not found in the table, the method ends at step 1135 to indicate to the user a need to manually identify the sample. If the difference is found in the LUT, at step 1140, the permittivity of the sample is determined and the method ends at step 1145, where the method outputs to the user a specific profile for the intended operating environment of the radar. The method of FIG. 11 can thus provide in-situation or immediate field sampling and permittivity values with the compact meander-line ring resonator.

Figure 12:
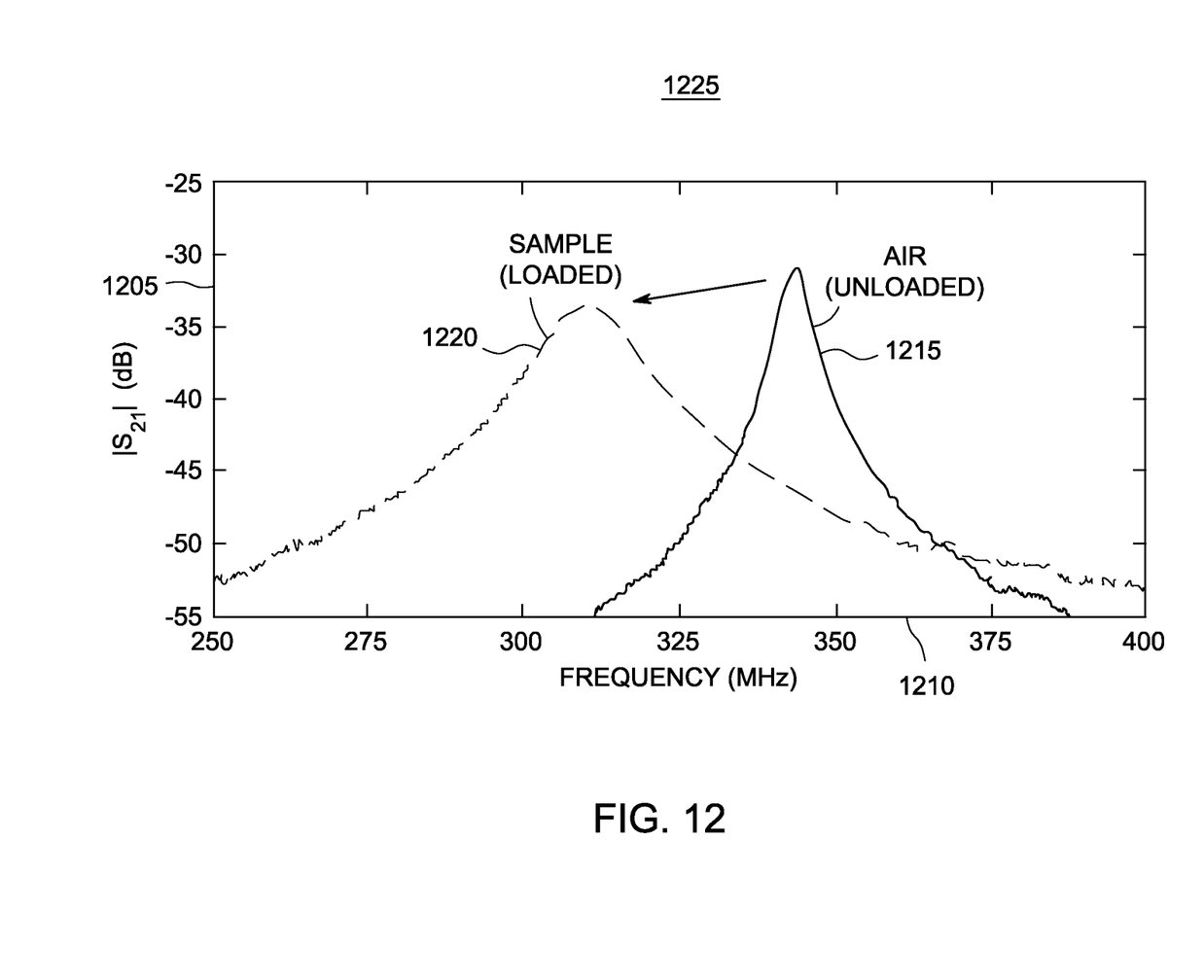
FIG. 12 depicts a graph of an exemplary frequency response from a particular sample compared to a baseline response when no sample is present.

FIG. 12 depicts a graph of an exemplary frequency response from a particular sample compared to a baseline response when no sample is present. FIG. 12 is a graph 1225 of an exemplary frequency response from a particular material 1220 compared to an air baseline 1215. The plotted results indicate a similar frequency response |S$_{21}$| 1205 but with a clear peak frequency shift 1210 of about 100 MHz between the bare resonator (unloaded) 1215 and the resonator with a sample (loaded) 1220. The comparison of the frequency shift from the electric field change can then be applied to the aforementioned look up table or other means of tabular comparison to known permittivity values.

Other embodiments of the present invention include applying the reduced insertion loss structure and/or meander-line structure of the resonator in other traditional RF communications circuitry. Meander-line geometries may be applied in circuits where frequencies lower than 1 GHz are necessary to be used while minimizing occupied space on the substrate.

While the foregoing is directed to embodiments of the present invention, other and further embodiments of the invention may be devised without departing from the basic scope thereof.

The invention claimed is:

1. An apparatus for measuring permittivity comprising:
a meander-line ring resonator, proximate to and separated from an input coupler and an output coupler, the meander-line ring resonator comprising a resonating ring formed of a continuous conductive material having at least two turns to form a single congruent pattern, symmetrical along at least one axis of the resonating ring and completely enclosing an area therewithin; and
a microcontroller configured to measure permittivity of a sample positioned in the vicinity of the meander-line ring resonator based on a frequency shift in the electric field of the meander-line resonator caused by the sample.

2. The apparatus of claim 1, further comprising:
the input coupler positioned on a side of the meander-line ring resonator, the input coupler elongated to conform to the side of the meander-line ring resonator; and
the output coupler positioned on an opposite side of the meander-line ring resonator, the output coupler elongated to conform to the opposite side of the meander-line ring resonator.

3. The apparatus of claim 2, wherein the input coupler and output coupler are comprised of a curved length that is a substantial percentage of the meander-line ring resonator.

4. The apparatus of claim 1, wherein the at least two turns further comprise at least one pair of arcuate portions and at least one pair of serpentine portions.

5. The apparatus of claim 4, wherein the input coupler and output coupler are arcuate and are substantially parallel, spaced apart from the arcuate portions of the meander-line ring resonator.

6. The apparatus of claim 4, wherein the at least one pair of serpentine portions further comprise at least three continuous symmetrical turns along the at least one axis.

7. The apparatus of claim 1, wherein the resonator is configured to resonate at a frequency below 1 GHz.

8. The apparatus of claim 1, wherein the at least one axis is coincident with input and output lines of the input and output couplers.

9. The method of assembling the apparatus of claim 1 comprising:
providing a ground plane; and
positioning the meander-line ring resonator on a different plane than the ground plane so as to improve permittivity measurement.

10. A method of modifying the apparatus of claim 1 comprising:
reducing the separation between the input and output couplers and the meander-line ring resonator and/or widening the length of the input and output couplers proximate to the meander-line ring resonator so as to decrease transmission loss of the meander-line ring resonator.

11. A method of modifying the apparatus of claim 1 comprising:
increasing the number of turns of the resonating ring while maintaining the same initial path length of the resonating ring so as to reduce the area enclosed by the resonating ring.

12. A method of using the apparatus of claim 1 comprising:
positioning the meander-line ring resonator in the vicinity of a sample;
measuring a frequency shift in the electric field of the meander-line resonator caused by the sample; and
determining the permittivity of the sample based on the measured frequency shift.

13. The apparatus of claim 1, wherein meander-line ring resonator comprises six, eight or twelve turns.

14. A method for measuring permittivity of a sample based on a change in the electric field comprising:
capacitively coupling a radio-frequency (RF) signal from an input coupler across a first gap to a meander-line ring resonator, where the meander-line ring resonator comprises a resonating ring formed of continuous conductive material on a substrate with at least two turns to form a single congruent pattern symmetrical along at least one axis of the resonating ring and completely enclosing an area therewithin;
resonating the RF signal within the meander-line ring resonator;

capacitively coupling the RF signal to the output coupler across a second gap to the meander-line ring resonator;

positioning the meander-line ring resonator in the vicinity of a sample; and measuring permittivity of the sample based on a frequency shift in the electric field of the meander-line resonator caused by the sample.

15. The method of claim 14, further comprising:

receiving the RF signal using an input line connected to the input coupler on a side of the meander-line ring resonator, the input coupler being elongated to conform to the side of the meander-line ring resonator; and outputting the RF signal using an output line connected to the output coupler on an opposite side of the meander-line ring resonator, the output coupler being elongated to conform to the opposite side of the meander-line ring resonator.

16. The method of claim 14, wherein the turns comprise at least one pair of arcuate portions and at least one pair of serpentine portions.

17. The method of claim 14, wherein the input coupler and output coupler are comprised of a curved length that is a substantial percentage of the meander-line ring resonator.

18. The method of claim 14, wherein the meander-line ring resonator further comprises at least three continuous symmetrical turns along the at least one axis.

19. The method of claim 14, wherein the meander-line ring resonator resonates at a frequency below 1 GHz.

20. The method of claim 14, further comprising:

storing the signal in memory; and subsequently positioning a dielectric sample proximate the meander-line ring resonator to generate a change in the frequency response of the meander-line ring resonator.

21. The method of claim 20, further comprising:

comparing the frequency response change with the previously stored data signal of the meander-line ring resonator when no dielectric sample was applied to determine permittivity.

22. A system for providing a portable permittivity measurement of a sample comprising:

a substrate;

an input coupler and an output coupler; the input coupler positioned separate from and opposite to an output coupler on the substrate;

a meander-line ring resonator, proximate to and separated from the input coupler and the output coupler, the meander-line ring resonator comprising a resonating ring formed of a continuous conductive material having at least two turns to form a single congruent pattern, symmetrical along at least one axis of the resonating ring and completely enclosing an area therewithin; and a portable computer coupled to the meander-line ring resonator, wherein the portable computer is configured to send a radio-frequency (RF) signal to the input coupler and to receive a RF signal from the output coupler and to measure permittivity of a sample positioned proximate the meander-line ring resonator, wherein the sample causes a change in the frequency response of the meander-line ring resonator.

23. The system of claim 22, further comprising:

memory configured to store the signal.

24. The system of claim 23, further comprising:

a microprocessor configured to compare the frequency response change with the previously stored signal of the meander-line ring resonator when no dielectric sample was applied to determine permittivity.

* * * * *